United States Patent [19]
Davies

[11] Patent Number: 5,155,052
[45] Date of Patent: Oct. 13, 1992

[54] VERTICAL FIELD EFFECT TRANSISTOR WITH IMPROVED CONTROL OF LOW RESISTIVITY REGION GEOMETRY

[76] Inventor: Robert B. Davies, 433 E. McKinley, Tempe, Ariz. 85281

[21] Appl. No.: 715,286

[22] Filed: Jun. 14, 1991

[51] Int. Cl.⁵ ......................................... H01L 21/265
[52] U.S. Cl. ........................... 437/40; 437/26; 437/27; 437/28; 437/29; 437/41
[58] Field of Search ................ 437/26, 27, 28, 29, 437/40, 41

[56] References Cited

U.S. PATENT DOCUMENTS

| | | | |
|---|---|---|---|
| 4,748,103 | 5/1988 | Hollinger | 437/41 |
| 4,774,198 | 9/1988 | Contiero et al. | 437/29 |
| 4,809,047 | 2/1989 | Temple | 352/23.4 |
| 4,879,254 | 11/1989 | Tsuzuki et al. | 437/41 |
| 4,895,810 | 1/1990 | Meyer et al. | 437/29 |
| 4,960,723 | 10/1990 | Davies | 437/41 |
| 4,970,173 | 11/1990 | Robb | 437/40 |
| 5,118,638 | 6/1992 | Fujihira | 437/29 |

FOREIGN PATENT DOCUMENTS 0130066 2/1985 Japan.
0266229 6/1987 Japan.

OTHER PUBLICATIONS

Mori et al., "An Insulated Gate Bipolar Transistor with a Self-Aligned DMOS Structure", IEEE IEDM, 1988, pp. 813-816.

Primary Examiner—Brian E. Hearn
Assistant Examiner—Trung Dang

[57] ABSTRACT

A method for making a vertical field effect transistor with improved commutating safe operating area is provided a sidewall spacer is formed around a polysilicon gate, and used as a mask for the formation of a low resistivity region. The low resistivity region is formed underneath a source region and extends laterally to within a few thousand angstroms of the lateral boundary of the source region. A central portion of the source region is subsequently removed exposing a portion of the underlying low resistivity region and a source electrode is formed in contact with the exposed low resistivity region and the source region.

5 Claims, 4 Drawing Sheets

5,155,052

VERTICAL FIELD EFFECT TRANSISTOR WITH IMPROVED CONTROL OF LOW RESISTIVITY REGION GEOMETRY

BACKGROUND OF THE INVENTION

The present invention relates, in general, to vertical field effect transistors. More particularly, the invention relates to vertical field effect transistors with improved commutating safe operating area.

Vertical field effect transistors, also called double diffused metal oxide semiconductor (DMOS) transistors comprise a polysilicon layer formed on a semiconductor substrate and selectively etched to form a polysilicon gate thereby exposing a portion of the substrate. The polysilicon gate is separated from the substrate by a gate oxide layer. For an N channel device, a P-type base and an N-type source are diffused into the exposed portion of the substrate using the polysilicon gate as a mask, so that a portion of both the source and the base extend beneath the polysilicon gate. A channel region is thus formed beneath the gate between the lateral boundaries of the source and the base. The semiconductor substrate serves as a drain for the DMOS transistor, and is N-type in the case of an N channel transistor. A gate electrode is formed in contact with the polysilicon gate, and a drain electrode is formed in contact with the substrate. For reasons discussed hereinafter a source electrode is formed in contact with both the source and the base of the transistor.

In normal operation, the gate region is activated by applying charge to the polysilicon gate, which causes an equal and opposite charge to form in the channel region. For the N channel transistor described hereinbefore, positive charge on the polysilicon gate causes a negative charge layer to form in the channel between the substrate and the source so that current can flow from the drain, through the channel, to the source. When negative charge, or no charge, is applied to the polysilicon gate, current flow through the channel is normally blocked by a P-N diode formed between the base and the substrate.

A parasitic bipolar transistor is formed by the source, which acts as an emitter, the base which acts as a base, and the substrate which acts as a collector. The source electrode shorts the base and the emitter of the parasitic transistor, as described hereinbefore. As long as current flow in the base is confined to the channel region, the source electrode effectively prevents turn on of the parasitic transistor. In some applications, however, the P-N diode formed by the base and the substrate is forward biased, allowing current to flow from the source electrode, through the base region, to the substrate.

In particular, some applications cause the diode to be cycled between a forward bias condition and a reverse bias condition, in which case charge moves from the source electrode to the periphery of the base when the device is switched from forward bias to reverse bias, causing current flow in the base underneath the source. This current flow is necessary to establish a depletion region in the P-N diode before the diode can support reverse bias, and is commonly called reverse recovery current. Applications which result in a reverse recovery current are called commutating mode applications. If resistance of the base region under the source is high, the parasitic bipolar transistor will turn on when the reverse recovery current flows, resulting in catastrophic failure of the transistor. Power limitation of the DMOS transistor operating in the commutating mode is hereinafter referred to as commutating safe operating area (CSOA) of the DMOS transistor.

In the past, the resistance of the base underneath the source was lowered by forming a low resistivity region of the same conductivity type as the base before forming the source so that the low resistivity region was adjacent to the source. The low resistivity region extended vertically beyond the base, so that reverse recovery current flowed primarily in the low resistivity region instead of the base, due to the lower resistance of the low resistivity region. For the N channel transistor this low resistivity region is p-type. The source was subsequently formed around the low resistivity region in a ring shape so that a portion of the low resistivity region was exposed in the middle of the source. A source electrode was then formed in contact with the exposed portion of the low resistivity region and the source. This method resulted in a relatively small low resistivity region extending under a small portion of the source due to the limitations of photolithographic processing, and offered limited CSOA improvement.

More recently, a method was used wherein the low resistivity region was formed using a phosphosilicate glass (PSG) sidewall spacer formed on an edge of the polysilicon gate. In this method the low resistivity region was formed using the PSG sidewall spacer as a mask, and the phosphorous in the PSG diffused into the silicon during thermal processing to form the source. Using this method, the low resistivity region was self-aligned to the polysilicon gate so that only a small portion of the source extended beyond the low resistivity region. This method, though offering improved CSOA performance, has limited application because the PSG sidewall spacer could not be removed without damaging the gate region, and it was undesirable to leave the PSG sidewall spacer in the device as it resulted in corrosion of the source electrode which was in contact with the oxide sidewall spacer.

SUMMARY OF THE INVENTION

The advantages of the present invention are achieved by providing a vertical field effect transistor wherein a sidewall spacer is formed around a polysilicon gate, and used as a mask for the formation of a low resistivity region. The low resistivity region is formed underneath a source region and extends laterally to within a few thousand angstroms of the lateral boundary of the source region. A central portion of the source region is subsequently removed exposing a portion of the underlying low resistivity region and a source electrode is formed in contact with the exposed low resistivity region and the source region.

DETAILED DESCRIPTION OF THE DRAWINGS

Figure 1:
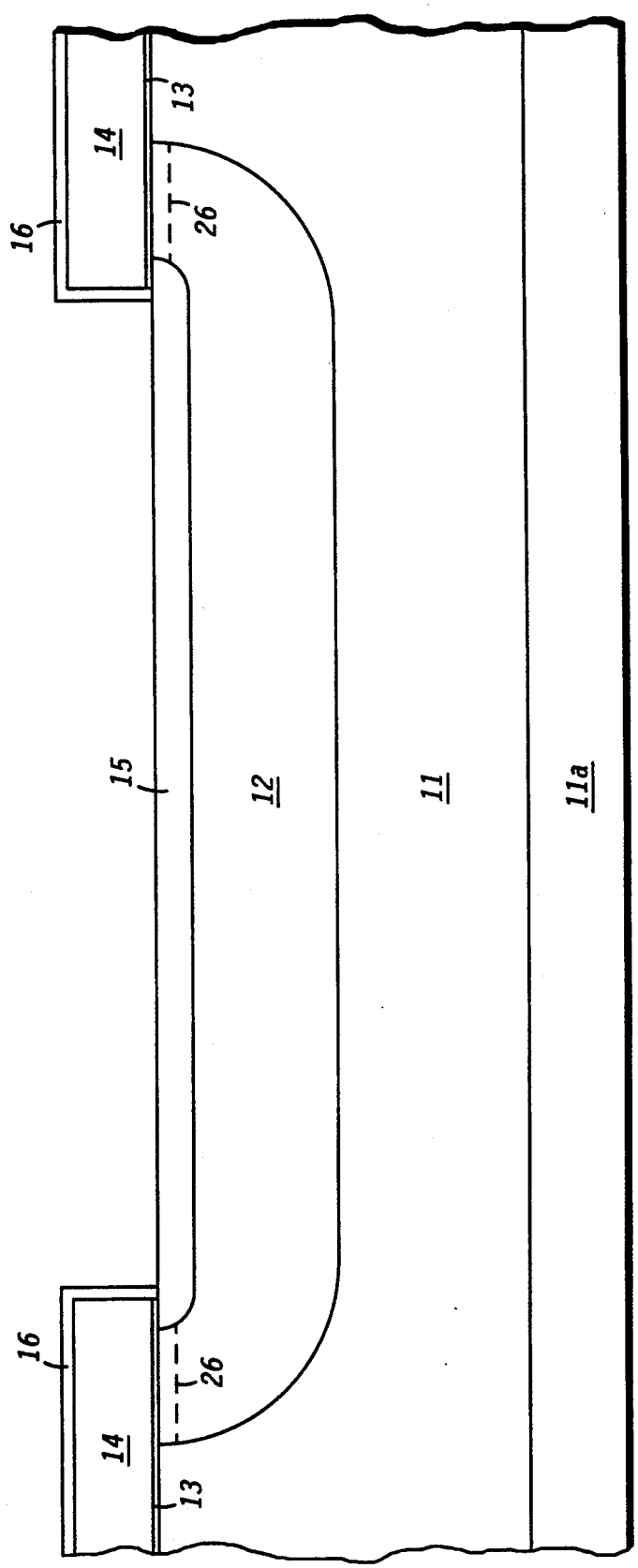
FIG. 1 illustrates an enlarged cross-sectional view of a partially completed DMOS field effect transistor formed in accordance with the method of the present invention.

FIG. 1 illustrates a cross-sectional view of a DMOS field effect transistor formed using the method of the present invention processed through metallization. DMOS field effect transistors usually comprise a plurality of similar cells such as shown in FIG. 1, all of the cells coupled in parallel. In a preferred embodiment the DMOS field effect transistor is an N channel transistor, though it should be understood that a P channel transistor could be manufactured with a similar process.

Silicon layer 11 is grown on an N-type or P-type substrate 11a. An N-type substrate 11a produces a conventional DMOS FET, while a P-type substrate 11a produces an insulated gate bipolar transistor (IGBT). Silicon layer 11 serves as a drift region or a voltage supporting region for the transistor, and will vary predictably in thickness and resistivity to meet predetermined device specifications. Gate oxide 13 is thermally grown on N-type silicon layer 11. Polysilicon gate 14 is formed by chemical vapor deposition, or similar process, of a polysilicon layer covering gate oxide 13. Holes are anisotripcally etched in polysilicon layer to form polysilicon gate 14. A notable feature of the present invention is the reduced feature size, and increased packing density of the transistor cells. For example, the present invention is optimized for polysilicon gate width of approximately 4.0–7.0 microns with a hole size of approximately 7.5 to 10.5 microns. It should be understood that as photolithography techniques improve, somewhat smaller geometries may be achieved using the method of the present invention.

As illustrated, a thin oxide 16 of a few hundred angstroms may optionally be formed to protect polysilicon gate 14 during subsequent processing. Oxide 16, however, does not materially affect subsequent processing in accordance with the present invention, and will not be illustrated in subsequent drawings. Also, a portion of gate oxide 13 is exposed by the etch used to form polysilicon gate 14. Because the exposed portion of gate oxide 13 is extremely thin, it is not included in FIGS. 1–4 to ease illustration. The exposed portion of oxide 13 is treated to a brief oxide etch to reduce thickness to about 200–400 angstroms and used as a pre-implant oxide to protect silicon layer 11.

P-type base 12 and N-type source 15 are diffused through a window formed by polysilicon gate 14 using polysilicon gate 14 as a mask. Thus channel region 26 is formed beneath gate 14 between lateral boundaries of P-type base 12 and N-type source 15, separated from polysilicon gate 14 by gate oxide 13. P-type base 12 is formed by a boron implant through the pre-implant oxide, and diffused to provide a 1.0–2.2 micron base 12. Doping concentration in base 12 is much higher than conventional structures to provide improved scaling and reduced cell size while maintaining typical threshold voltages. Source 15 is formed by ion implantation of arsenic and diffusion to 0.2–0.5 microns. It is important that arsenic be used for source 15 to achieve improved control over size and composition of source 15. As will be seen, control over source 15 is critical to performance and yield.

Figure 2:
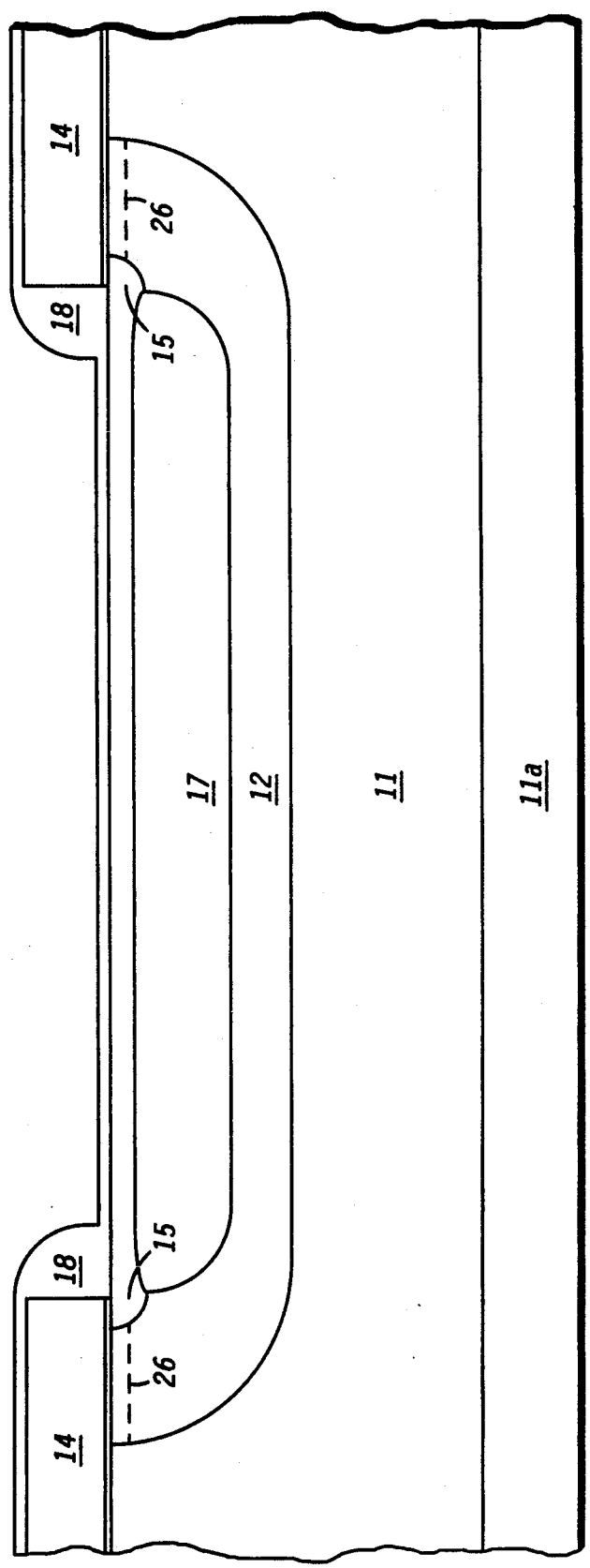
FIGS. 2-3 illustrate enlarged crosssectional views of a portion of the DMOS transistor shown in FIG. 1 further in processing.

As shown in FIG. 2, sidewall spacer 18 is formed along one edge of gate 14 by depositing a layer of material over the entire surface of the device and anisotropically etching the deposited layer. The anisotropic etch removes the deposited layer in a vertical direction without removing the layer in the horizontal direction thus leaving sidewall spacer 18 after the anisotropic etch process. Sidewall spacer 18 is formed without an additional photo alignment step, thus it is self-aligned to the polysilicon gate. As will become apparent, width of sidewall spacer 18 is a critical feature of the present invention, and superior control of size, shape, and material composition of spacer 18 is required to achieve desired performance at high manufacturing yields. Requirements of spacer 18 will be described in greater detail hereinafter.

Low resistivity region 17 is formed underneath the source using oxide sidewall spacer 18 as a mask, as shown in FIG. 2. The anisotropic etch process used to form sidewall spacer 18 exposes a portion of pre implant oxide 13a. Dopant of the same conductivity type as base 12 is implanted through pre-implant oxide 13a and source region 15 so that only a small portion of the implanted dopant is left in source region 15. It is important that the implanted dopant has sufficient energy to penetrate source 15 so that resistivity and conductivity type of source 15 are substantially unchanged. Oxide sidewall spacer 18 acts as a mask to the ion implantation.

Width of sidewall spacer 18 is a critical feature of the present invention, and is determined by thickness of the deposited layer from which sidewall spacer 18 was etched. In a preferred embodiment, spacer 18 is about as wide as thickness of polysilicon gate 14, or about 0.3–0.8 microns. Thinner spacer width corresponds to smaller source depth for optimal performance, thus actual thickness is a design choice based on diffusion and film deposition technology. Width of sidewall spacer 18 determines relative spacing between source 15, base 12, and low resistivity region 17. If this spacing is too small, or varies widely due to the process control of forming spacer 18, low resistivity region 17 will extend into channel 26, destroying the device. For example, it has been found that if a thin oxide, analogous to oxide 15 shown in FIG. 1, is used rather than a sidewall spacer 18, insufficient separation between base 12 and low resistivity region 17 is provided, and correspondingly low yields result. On the other hand, if spacing is too large, low resistivity region 17 will be reduced in size and CSOA performance is compromised. It has been found that it is critical to yield and performance that sidewall spacer 18 be carefully controlled.

Width of sidewall spacer 18 determines both size of low resistivity region 17 and of source region 15, which in turn are two of the most critical factors to achieve improved safe operating area. It has been found that a precarious balance exists between reducing surface area of source 15, increasing size of low resistivity region 17, and providing sufficient contact area to source 15 and low resistivity region 17. This balance must be made against a background concern of reducing overall cell size.

Unlike prior structures, the present invention uses sidewall spacer 18 to precisely determine size and alignment of low resistivity region 17, and especially lateral spacing between low resistivity region 17 and base 12 and source 15. When a conventional photolithography step is used to define low resistivity region 17, the low resistivity region is too large resulting in poorer performance and larger overall chip size. Even when a sidewall spacer 18 is used, it has been found that the particular material chosen for spacer 18 is critical. Excess curvature on an upper surface of a sidewall spacer, typical with most sidewall spacer materials and processes, results in inadequate control of size and shape of source 15 and low resistivity region 17. It has been found that hotwall TEOS gives superior performance with reduced curvature at the upper surface of spacer 18. Hotwall TEOS is also free of high phosphorous concentrations which reduce device reliability due to metal corrosion. It has also been found that unless hotwall TEOS or a material providing similar performance is used, device yield and performance is greatly reduced.

Figure 3:
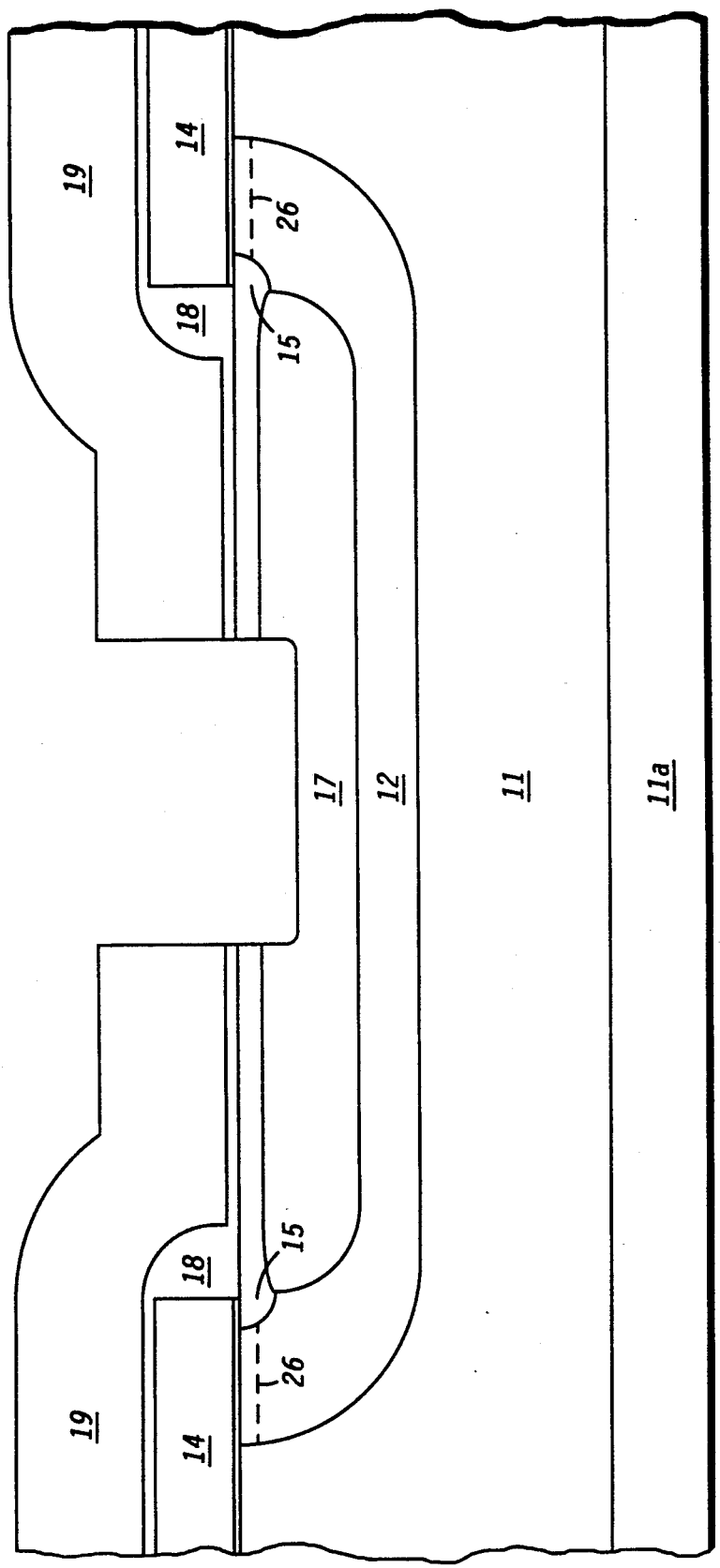

FIG. 3 illustrates an enlarged cross-sectional view of the DMOS transistor further along in processing. Low resistivity region 17 is formed underneath source 15 by thermal activation of the implanted ions. Oxide layer 19 is formed completely covering polysilicon gate 14, oxide sidewall spacer 18, and source 15. Oxide layer 19, pre implant oxide 13a, source 15, and a portion of low resistivity region 17 are anisotropically etched so that a portion of low resistivity region 17 is exposed. Oxide layer 19 may be partially wet etched resulting in a sloped sidewall as shown in FIG. 4.

Figure 4:
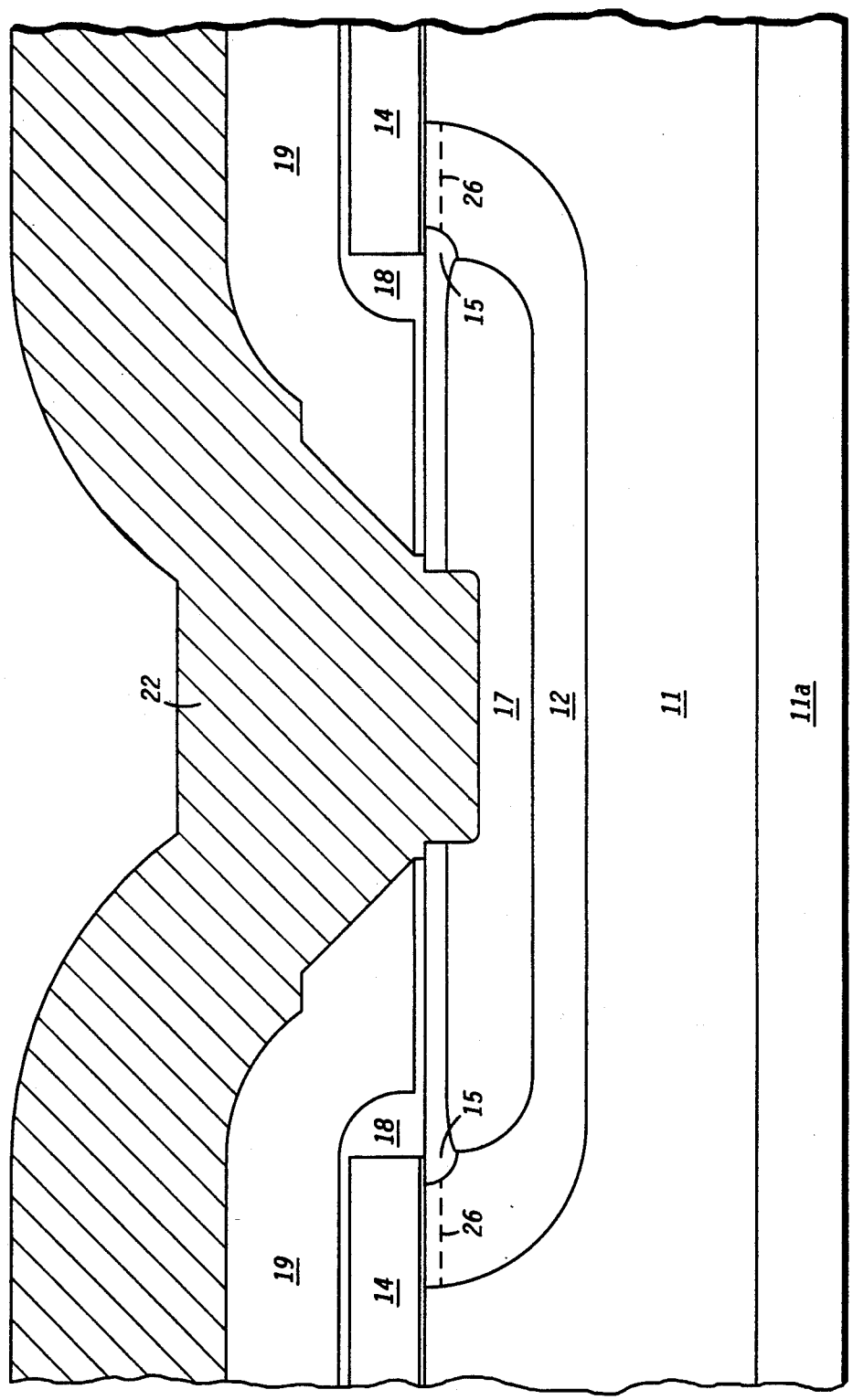
FIG. 4 illustrates a cross-sectional views of a portion of the DMOS transistor shown in FIG. 1 at a final stage of processing.

Oxide layer 19 is then isotropically etched as shown in FIG. 4. to expose a portion of source 15. Source electrode 22 is formed in contact with low resistivity region 17 and source region 15 so as to short together low resistivity region 17 and source 15 which form a base and an emitter of a parasitic bipolar transistor. A gate electrode (not shown) is formed in contact with polysilicon gate 14. In operation, positive charge is applied to polysilicon gate 14 causing a negative charge layer to develop in channel region 26. The negative charge layer couples source 15 and substrate 11a so that current flows from source electrode 22 through source region 15 through channel 26 through substrate 11 to drain electrode 24.

The combination of low resistivity region 17 formed underneath source 15 with a subsequent removal of a portion of source 15 lowers gain and series base resistance of the parasitic bipolar transistor, and greatly reduces any possibility of turn on of the parasitic transistor.

It should be appreciated that a vertical field effect transistor has been provided wherein the low resistivity region is formed underneath the source, and self-aligned to the polysilicon gate, without requiring the use of a highly doped oxide sidewall spacer to form the source. Elimination of the highly doped oxide sidewall spacer greatly improves the reliability of the transistor. The low resistivity region of the vertical field effect transistor is shorted to the source so that the base and the emitter of the parasitic bipolar transistor are shorted together, preventing turn on of the parasitic transistor and improving commutating safe operating area.

I claim:

1. A method of making a vertical field effect transistor comprising the steps of: providing a semiconductor substate; forming a epitaxial region of a first conductivity type on the substrate; forming a gate oxide on a surface of the epitaxial region; forming a patterned polysilicon gate on the gate oxide; forming a base region of a second conductivity type in the substrate using the patterned polysilicon gate as a mask; forming a source region of the first conductivity type in the base region using the patterned polysilicon gate as a mask; forming an oxide spacer on a sidewall of the patterned polysilicon gate using hotwall TEOS process, wherein the spacer is 0.3–0.8 microns thick; forming a low resistivity region of the second conductivity type underneath the source using the sidewall spacer as a mask, wherein the low resistivity region is completely covered by the source; forming an oxide layer completely covering the source; selectively patterning the oxide layer to expose a first portion of the source; removing the first portion of the source to expose a portion of the low resistivity region; isotropically etching the oxide layer to expose a second portion of the source; and forming a source electrode in contact with the low resistivity region and the source.

2. The method of claim 1 further comprising the step of thermally oxidizing the polysilicon gate after patterning to form an oxide seal around the polysilicon gate.

3. The method of claim 1 wherein the low resistivity region is formed by ion implantation through the source so that the conductivity type of the source after ion implantation is the same as before ion implantation.

4. The method of claim 1 wherein the low resistivity region is self-aligned to the gate and an outer dimension of the low resistivity region is spaced a distance from the base region, the distance being determined by the width of the oxide spacer.

5. The method of claim 1 wherein the patterned polysilcion gate is approximately 5.0–7.0 microns wide, the base region is in the range of 1.0 to 2.2 microns deep, and the source is in the range of 0.2 to 0.5 microns deep.

* * * * *

UNITED STATES PATENT AND TRADEMARK OFFICE
CERTIFICATE OF CORRECTION

PATENT NO. : 5,155,052
DATED : October 13, 1992
INVENTOR(S) : Robert B. Davies

It is certified that error appears in the above-indentified patent and that said Letters Patent is hereby corrected as shown below:

Claim 1, Column 6, line 9, change "substate" to --substrate--.

Signed and Sealed this

First Day of November, 1994

Attest:

BRUCE LEHMAN

Attesting Officer          Commissioner of Patents and Trademarks